United States Patent [19]

Lambourn

[11] 3,955,191
[45] May 4, 1976

[54] ANALOG-TO-DIGITAL CONVERTER

[75] Inventor: Edward Harry Lambourn, Enfield, England

[73] Assignee: International Standard Electric Corporation, New York, N.Y.

[22] Filed: Dec. 12, 1974

[21] Appl. No.: 532,111

[30] Foreign Application Priority Data

Mar. 5, 1974 United Kingdom............... 09770/74

[52] U.S. Cl.................... 340/347 NT; 340/347 AD; 307/235 K; 332/1
[51] Int. Cl.² ........................................ H03K 13/20
[58] Field of Search............... 340/347 AD, 347 NT; 332/1; 307/235 K

[56] References Cited

UNITED STATES PATENTS 3,810,151   5/1974   Johnston et al............. 340/347 AD

*Primary Examiner*—Charles D. Miller
*Attorney, Agent, or Firm*—John T. O'Halloran; Menotti J. Lombardi, Jr.; Alfred C. Hill

[57] ABSTRACT

A single channel analog-to-digital converter of the pulse density code type includes a D-type flip flop, a clock source to clock the flip flop, an analog signal input coupled to the D input of the flip flop and at least one feedback circuit connected from the $\overline{Q}$ output of the flip flop to the D input of the flip flop. The feedback circuit includes a means to integrate the $\overline{Q}$ output signal of the flip flop.

14 Claims, 8 Drawing Figures

ANALOG-TO-DIGITAL CONVERTER

BACKGROUND OF THE DISCLOSURE

This invention relates to an analog-to-digital converter and is particularly applicable for use in single channel PCM (pulse code modulation) equipment.

SUMMARY OF THE INVENTION

An object of the present invention is to provide an analog-to-digital converter of the pulse density code types.

A feature of the present invention is the provision of an analog-to-digital converter comprising a D-type flip flop having a D input, a Q output, a $\bar{Q}$ output and a clock input; a first source of clock signal coupled to the clock input; first means for coupling an analog signal to the D input; at least a first feedback circuit connected from the $\bar{Q}$ output to the D input; the first feedback circuit including a second means to integrate the output signal from the $\bar{Q}$ output; and an output for the converter coupled to the $\bar{Q}$ output.

The output of this type of converter is a pulse stream in which the density of the pulses, i.e. the average number of pulses in a given period, is proportional to the amplitude of the signal being encoded and is referred to as a pulse density code.

BRIEF DESCRIPTION OF THE DRAWINGS

Above-mentioned and other features and objects of this invention will become more apparent by reference to the following description taken in conjunction with the accompanying drawing, in which.

DESCRIPTION OF THE PREFERRED EMBODIMENTS

Figure 1:
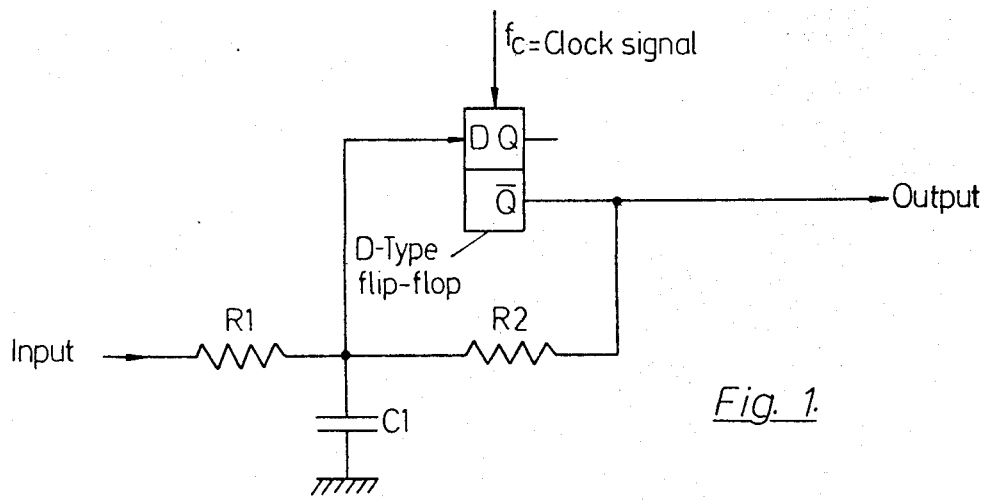
FIG. 1 illustrates a simple analog-to-digital converter in accordance with the principles of this invention.

In the simple circuit shown in FIG. 1 an analog input signal is applied via resistor R1 to the input D of a D-type flip flop. This is a bistable device in which the sign of the output $\bar{Q}$ will be the inverse of the sign of the D input whenever the device is triggered by a signal $f_c$, in this case a clock signal. The flip flop also has a complementary output Q, the significance of which will become apparent later on. The $\bar{Q}$ output, which is also the output of the converter, is applied via a feedback path, which includes resistor R2, to the D input of the flip flop. The flip flop input is also connected to a capacitor C1, which for convenience is shown as being grounded at its other terminal.

Figure 2:
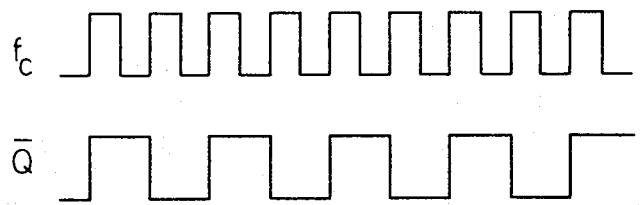
FIG. 2 illustrates the relationship between a clock waveform and the output waveform for the circuit of FIG. 1 in the absence of an input signal.
Figure 3:
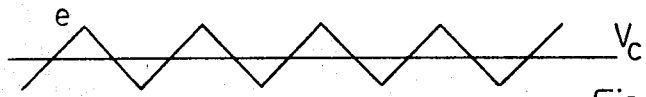
FIG. 3 illustrates the voltage on the capacitor of FIG. 1 in the absence of an input signal.

Consider first the action of the circuit in the absence of an input signal. The voltage across the capacitor C1 is derived from the $\bar{Q}$ output of the flip flop. When the $\bar{Q}$ output goes positive, the voltage e rises and crosses the triggering threshold level $V_c$ for the flip flop (FIG. 3). When next the flip flop is clocked, the positive voltage at the D input causes $\bar{Q}$ output to go negative. This causes the voltage on the capacitor to go negative and, at the next clock pulse, $\bar{Q}$ output will go positive. The time constants of the circuit are chosen so that the $\bar{Q}$ output changes sign every alternate clock pulse, as shown in FIG. 2.

Figure 4:
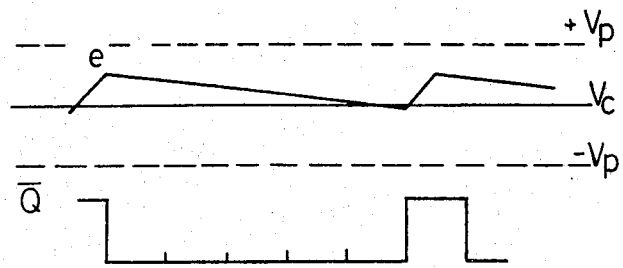
FIG. 4 illustrates the relationship between the voltage on the capacitor of FIG. 1 and the output of the circuit when an input signal is present.

Consider now what happens when an input signal of positive amplitude is presented to the circuit. Current will flow in R1 and will tend to reinforce the positive going outputs from $\bar{Q}$ output. The circuit will then maintain its positive going input at the D input and $\bar{Q}$ output will continue negative until sufficient time has elapsed to bring e back to just below the threshold level $V_c$. $\bar{Q}$ output will then go positive for one clock pulse, whereupon the combination of the input and the brief positive $\bar{Q}$ output pulse will again cause e to stay positive until e is brought back to just below $V_c$. FIG. 4 illustrates the relationship between e and $\bar{Q}$ output for a positive input signal. It will be seen that the $\bar{Q}$ output is a pulse train in which the ratio of "spaces" to "marks" is increased compared to the 1:1 ratio of the no input, or idling, condition. The ratio of "spaces" to "marks" is proportional to the amplitude of the input signal. For a negative going input signal the situation is reversed, the number of "marks" being greater than the number of "spaces." However, only a very small change causes the pattern of $\bar{Q}$ output pulses generated by the flip flop to be modulated such that the average current flowing in resistor R2 is equal and opposite to that in resistor R1. This change must be held within the limits +Vp and −Vp of the flip flop input threshold. Provided the input signal is maintained within these limits the pulse pattern at any given input signal sample has an average analog value equivalent to the signal (when resistor R1 equals resistor R2) and is pulse density modulated.

The maximum encodable signal peak will be limited to ±Vp because at these levels the $\bar{Q}$ output is an all "space" or all "mark" signal. Input signals exceeding these limits will be completely clipped. The time constant $T_o = RC/2$ (when R1=R2=R) is chosen so that the maximum signal frequency does not exceed $\frac{1}{2}\pi T_o$.

Figure 5:
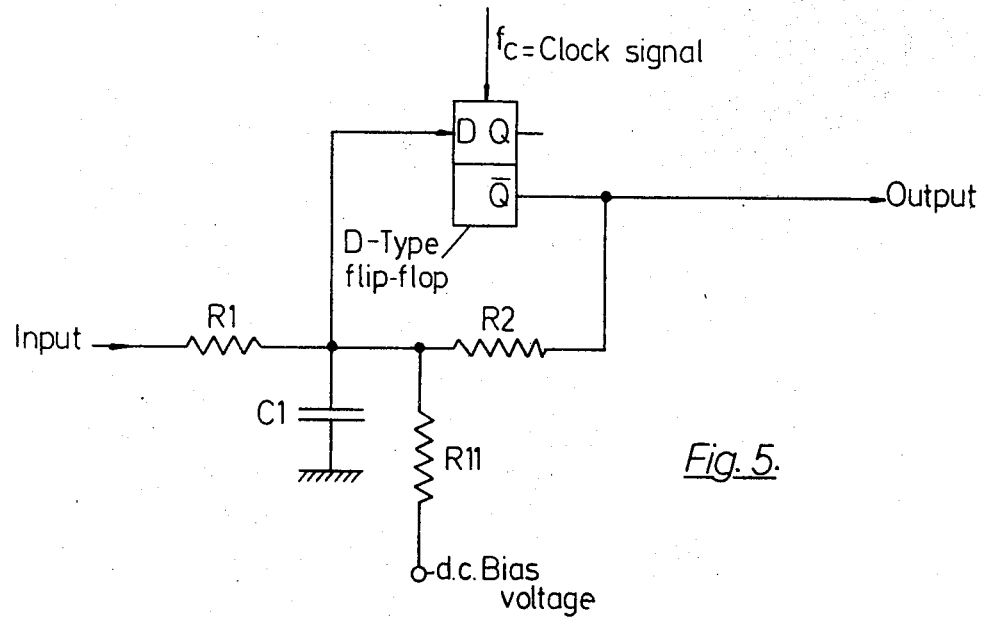
FIG. 5 illustrates a modification of the circuit of FIG. 1 in which a d.c. (direct current) bias voltage is applied.

In practice it is often desirable to encode signals which are offset from zero, i.e. the input signal while changing amplitude is always of one sign. In the circuit of FIG. 5 a d.c. bias voltage is introduced via resistor R11. The d.c. bias is chosen so that the threshold level $V_c$ falls midway in the amplitude range of the signal to be encoded.

Figure 6:
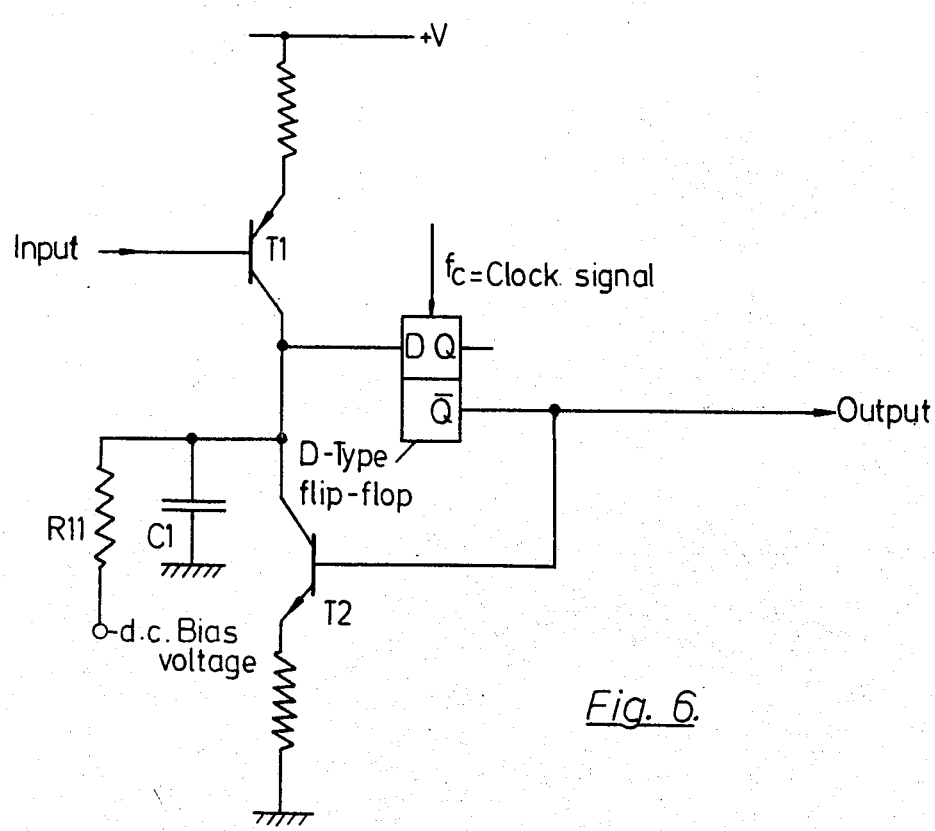
FIG. 6 illustrates a further modification of FIG. 1 in which the circuit employs current gain.

If the circuit is required to have gain resistors R1 and R2 are replaced by transistors T1 and T2, as shown in FIG. 6. This circuit also includes the d.c. bias arrangement of FIG. 5.

Figure 7:
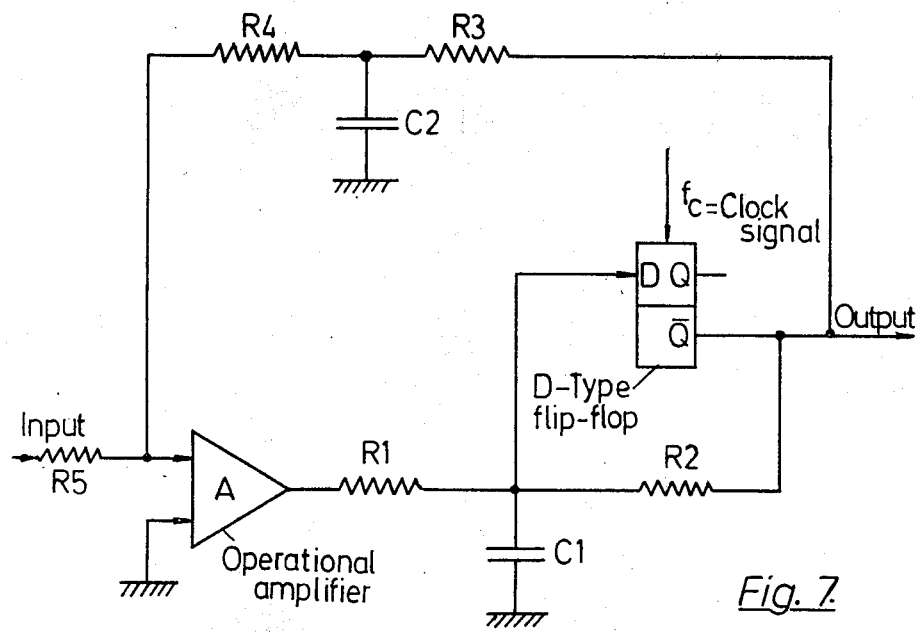
FIG. 7 illustrates another modification of the circuit of FIG. 1 in which the converter is included in the feedback path of an amplifier.

The dynamic range of the circuits so far described is limited by the coarsest quantizing step which normally occurs at the center of the range (the idling level). One way of overcoming this is to provide a "dither" signal of suitable frequency outside the signal pass band. This in effect causes the input signal to exceed the positive going and negative going thresholds at frequent intervals even when the changes in the input signal are so small that normally no such crossing of $V_c$ would occur. This technique may readily be accomplished by inserting the converter of FIG. 1 in the feedback loop of a high gain operational amplifier, as shown in FIG. 7. The input signal is applied via resistor R5 to one input of operational amplifier A. The $\overline{Q}$ output is applied not only to capacitor C1 via resistor R2 but also to the same input of the amplifier via a feedback path which includes resistors R3 and R4 and capacitor C2. The pulse output of $\overline{Q}$ output is effectively demodulated by the filtering action of resistor R3 and capacitor C2 and the resulting analog signal is fed through resistor R4 to the input of amplifier A. If the open loop gain of amplifier A is very high the closed loop gain is given by $$\frac{E_o}{E_s} = \frac{R4}{R5}$$

where $E_s$ is the input voltage and $E_o$ is the voltage on capacitor C2. The output waveform from the amplifier will be such that the decoded $\overline{Q}$ output will maintain this equation. Therefore the encoding errors will be minimized and especially the effects of large quantum steps. This results in an improvement in the levels of harmonic distortion of the converter.

Figure 8:
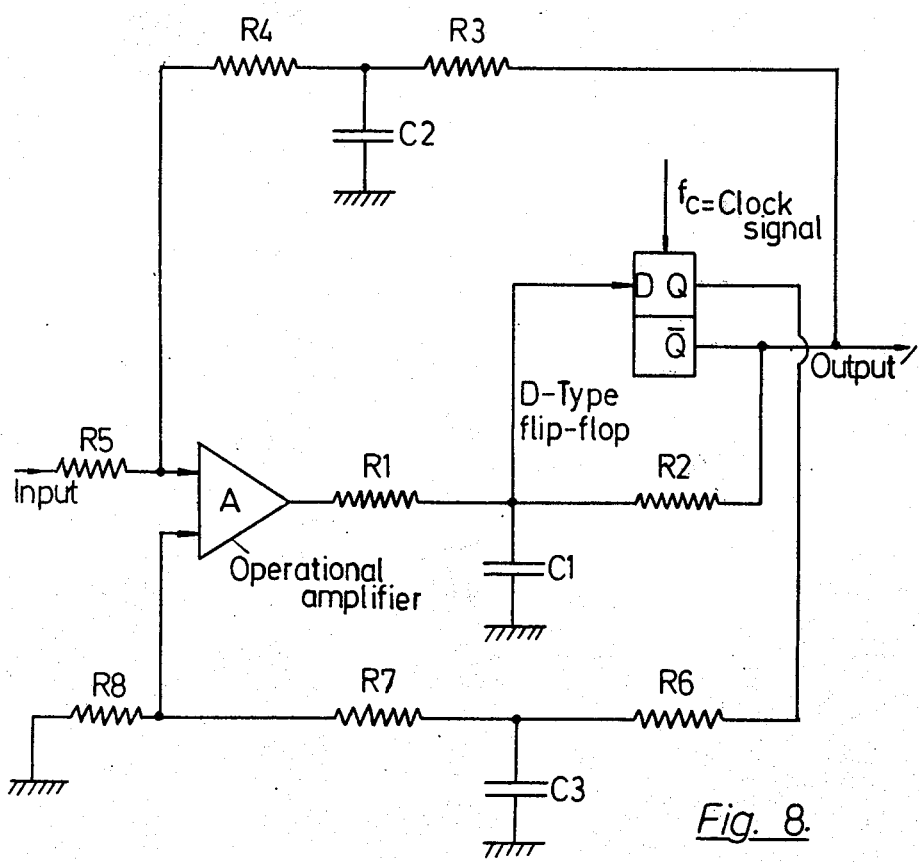
FIG. 8 illustrates a modification of the circuit of FIG. 7 in which an automatic bias voltage is incorporated.

In the modification of the circuit of FIG. 7 which is shown in FIG. 8 an automatic biassing is incorporated, in contrast to the d.c. biassing of the earlier figures. The Q output of the flip flop is fed back via a smoothing circuit containing resistors R6 and R7 and capacitor C3 to the other input of the operational amplifier A, which is grounded via resistor R8. To provide effective bias resistor R5 should be equal to resistor R8 and R3 + R4 = R6 + R7. The bias applied to the circuit is thus made to vary automatically as the densisty of the $\overline{Q}$ output pulses varies.

While I have described above the principles of my invention in connection with specific apparatus it is to be clearly understood that this description is made only by way of example and not as a limitation to the scope of my invention as set forth in the objects thereof and in the accompanying claims.

I claim:
1. An analog-to-digital converter of the pulse density code type comprising:
 a D-type flip flop having a D input, a Q output, a $\overline{Q}$ output and a clock input;
 a first source of clock signal coupled to said clock input;
 first means for coupling an analog signal to said D input;
 at least a first feedback circuit connected from said $\overline{Q}$ output to said D input;
 said first feedback circuit including
  a second means to integrate the output signal from said $\overline{Q}$ output; and
 an output for said converter coupled to said $\overline{Q}$ output to provide a pulse density code pulse stream.
2. A converter according to claim 1, wherein said first means includes
 a first resistor coupled to said D input; and
said second means includes
 a second resistor having one terminal coupled to said $\overline{Q}$ output and the other terminal coupled to said D input, and
 a capacitor coupled between said D input and ground.
3. A converter according to claim 2, further including
 third means to couple a bias voltage to said D input.
4. A converter according to claim 3, wherein said third means includes
 a second source of d.c. bias voltage, and
 a third resistor to couple said second source to said D input.
5. A converter according to claim 1, further including
 third means to couple a bias voltage to said D input.
6. A converter according to claim 5, wherein said third means includes
 a second source of d.c. bias voltage, and
 a resistor to couple said second source to said D input.
7. A converter according to claim 1, wherein said first means includes
 a first amplifier stage coupled to said D input; and
said second means includes
 a second amplifier stage coupled between said $\overline{Q}$ output and said D input, and
 a capacitor coupled between said D input and ground.
8. A converter according to claim 7, further including
 third means to couple a bias voltage to said D input.
9. A converter according to claim 8, wherein said third means includes
 a second source of d.c. bias voltage, and
 a resistor to couple said second source to said D input.
10. A converter according to claim 1, wherein said first means includes
 a second source of analog signal,
 an operational amplifier having one input coupled to ground, the other input coupled to said second source and an output coupled to said D input;
further including
 a second feedback circuit coupled from said $\overline{Q}$ output to said other input of said operational amplifier,
 said second feedback circuit including
 a third means to integrate the output signal from said $\overline{Q}$ output.
11. A converter according to claim 10, wherein said first means further includes
 a first resistor coupled between said output of said operational amplifier and said D input;
said second means includes
 a second resistor having one terminal coupled to said $\overline{Q}$ output and the other terminal coupled to said D input; and
 a first capacitor coupled between said D input and ground; and
said third means includes
 a third resistor having one terminal coupled to said $\overline{Q}$ output,
 a fourth resistor having one terminal coupled to the other terminal of said third resistor and the other terminal coupled to said other input of said operational amplifier; and
 a second capacitor coupled between the junctions of said third and fourth resistors and ground.
12. A converter according to claim 11, further including fourth means to couple a bias voltage to said D input.

13. A converter according to claim 12, wherein said fourth means includes
- a fifth resistor to couple said one input of said operational amplifier to ground, and
- a third feedback circuit coupled between said Q output and said one input of said operational amplifier,
- said third feedback circuit including
  - a fifth means to integrate the output signal from said Q output.

14. A converter according to claim 13, wherein said fifth means including
- a sixth resistor having one terminal coupled to said Q output,
- a seventh resistor having one terminal coupled to the other terminal of said sixth resistor and the other terminal coupled to said one input of said operational amplifier, and
- third capacitor coupled between the junctions of of said sixth and seventh resistors and ground.

* * * * *